(12) United States Patent
Chang et al.

(10) Patent No.: US 8,633,908 B2
(45) Date of Patent: Jan. 21, 2014

(54) METHOD OF FABRICATING ELECTRONIC APPARATUS

(75) Inventors: Yi-Shan Chang, Yilan County (TW); Juin-Ming Wu, Taoyuan County (TW); Shih-Hsiung Lin, Hsinchu (TW); Ying-Cheng Chen, Hsinchu County (TW); Sheng-Hung Wang, Kaohsiung (TW); Wen-Hau Lee, Chiayi County (TW); Chang-Cheng Chen, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 557 days.

(21) Appl. No.: 12/915,017

(22) Filed: Oct. 29, 2010

(65) Prior Publication Data

US 2012/0026102 A1 Feb. 2, 2012

(30) Foreign Application Priority Data

Jul. 29, 2010 (TW) .............................. 99125148 A

(51) Int. Cl.
*G06F 3/041* (2006.01)
(52) U.S. Cl.
USPC .......................................... 345/173; 430/311
(58) Field of Classification Search
USPC ............ 345/104, 173–178; 178/18.01–18.09, 178/18.11; 438/118; 156/60; 430/311
See application file for complete search history.

(56) References Cited

U.S. PATENT DOCUMENTS

| | | | |
|---|---|---|---|
| 6,579,398 | B1 * | 6/2003 | Ogawa .......................... 156/230 |
| 2009/0011197 | A1 * | 1/2009 | Matsuhira ..................... 428/192 |
| 2009/0104412 | A1 * | 4/2009 | Han et al. .................... 428/195.1 |
| 2009/0229732 | A1 * | 9/2009 | Determan et al. .............. 156/60 |

FOREIGN PATENT DOCUMENTS

| | | |
|---|---|---|
| JP | 11133442 | 5/1999 |
| JP | 2003-005766 | 1/2003 |
| JP | 2008-102197 | 5/2008 |
| TW | I233667 | 6/2005 |

* cited by examiner

*Primary Examiner* — Stephen Sherman
(74) *Attorney, Agent, or Firm* — Jianq Chyun IP Office

(57) ABSTRACT

A method of fabricating an electronic apparatus having an active region and a peripheral region surrounding the active region is described. A first main device and a second main device are provided. An optical clear liquid adhesive (OCLA) is applied between the first main device and the second main device and within the active region. A photo-mask having a transparent region and an opaque region is provided above the second main device, and the transparent region corresponds to the peripheral region. An OCLA diffusion process is performed such that the OCLA diffuses from the active region to the peripheral region. During the OCLA diffusion process, a first irradiating process with the photo-mask is performed, such that the OCLA diffusing to the peripheral region is partially cured. After removing the photo-mask, a second irradiating process is performed, such that the OCLA is completely cured.

17 Claims, 5 Drawing Sheets

METHOD OF FABRICATING ELECTRONIC APPARATUS

CROSS-REFERENCE TO RELATED APPLICATION

This application claims the priority benefit of Taiwan application serial no. 99125148, filed on Jul. 29, 2010. The entirety of the above-mentioned patent application is hereby incorporated by reference herein and made a part of this specification.

BACKGROUND OF THE INVENTION

1. Field of the Invention

The invention is related to an electronic apparatus and a method of fabricating the same, and in particular to a display and a method of fabricating the same.

2. Description of Related Art

In order to achieve goals of being more convenient, more light-weight, and more user-friendly, many electronic products have adopted touch panels instead of conventional keyboards and mice as their input devices. Touch display panels which have both touch and display functions have become one of the most popular products nowadays. Generally, touch display panels may be classified into externally adhered touch display panels or built-in touch display panels.

In an externally adhered touch display panel, a display panel and a touch panel are generally separately fabricated and then adhered to each other. A conventional adhesion method is applying an ultraviolet (UV) or visible light curing adhesive on the display panel or the touch panel, and adhering the display panel and the touch panel by irradiating and pressing. However, during the above processes of irradiating and pressing, since the UV or visible light curing adhesive is difficult to control, problems of adhesive overflow often occur. The leaked adhesive may contaminate fabrication equipment, thereby reducing yield and affecting reliability of products.

SUMMARY OF THE INVENTION

The disclosure provides a method of fabricating an electronic apparatus, which prevents problems of adhesive overflow when a display panel and a touch panel are adhered to each other.

The disclosure provides an electronic apparatus which is formed by using the above fabricating method.

The disclosure provides a method of fabricating an electronic apparatus, wherein the electronic apparatus includes an active region and a peripheral region surrounding the active region. The method includes providing a first main device and a second main device. An optically clear liquid adhesive (OCLA) is applied between the first main device and the second main device, and the OCLA is applied in the active region. A photo-mask is provided above the second main device, wherein the photo-mask has a transparent region and an opaque region, and the transparent region corresponds to the peripheral region. An OCLA diffusion process is performed, so that the OCLA diffuses from the active region to the peripheral region, wherein during the OCLA diffusion process, a first irradiating process is simultaneously performed with the photo-mask, so the OCLA is partially cured when it diffuses to the peripheral region. After the photo-mask is removed, a second irradiating process is performed, so that the OCLA is fully cured.

The disclosure provides an electronic apparatus which has an active region and a peripheral region surrounding the active region. The electronic apparatus includes a first main device, a second main device, and a cured OCLA. The first main device and the second main device are disposed opposite to each other. The cured OCLA is disposed between the first main device and the second main device and fully fills the active region and partially diffuses to the peripheral region, wherein a curing rate of the cured OCLA which fully fills the active region is less than a curing rate of the cured OCLA which diffuses to the peripheral region.

In summary, when performing the OCLA diffusion process, the first irradiating process is also performed with the photo-mask, so that the OCLA is partially cured when it diffuses to the peripheral region. Since the OCLA is cured and unable to flow outward and/or inward once irradiated, problems of adhesive overflow during conventional adherence processes are prevented.

In order to make the aforementioned and other objects, features and advantages of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1A:
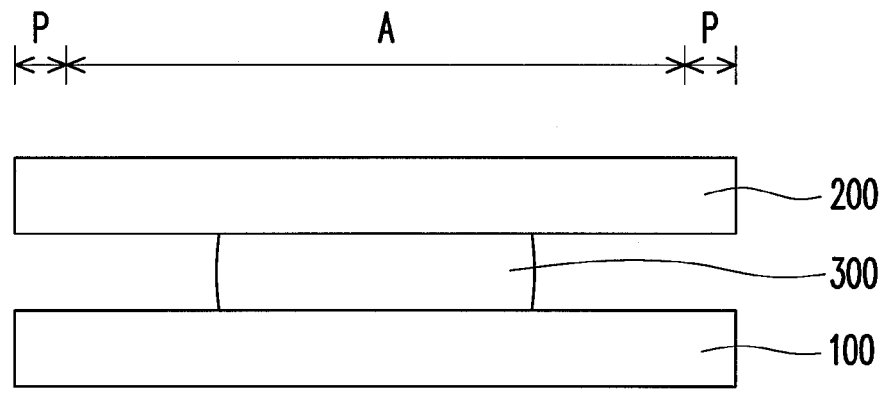
FIGS. 1A to 1D are schematic diagrams showing a process of fabricating an electronic apparatus according to an embodiment of the disclosure.

FIGS. 1A to 1D are schematic diagrams showing a process of fabricating an electronic apparatus according to an embodiment of the disclosure. Please refer to FIG. 1A. A first main device 100 and a second main device 200 are provided. The electronic apparatus formed by the first main device 100 and the second main device 200 has an active region A and a peripheral region P which surrounds the active region A (as shown in FIG. 2)

According to the present embodiment, the first main device 100 may be a display panel, which is, for example, a liquid crystal display panel, an organic luminescent display panel, an electrophoretic display panel, or another type of display panel. The second main device 200 may be a touch panel, which is, for example, a capacitive touch panel, a resistive touch panel, an optical touch panel, or another type of touch panel. However, the disclosure is not limited to the above configuration. According to another embodiment, the first main device 100 may be another type of main device, such as a touch panel. The second main device 200 may also be another type of main device, such as a cover lens.

According to the embodiment, the first main device 100 is a display panel which includes a bottom substrate, a top substrate, and a display medium disposed between the top substrate and the bottom substrate. Generally, the bottom substrate may be termed a pixel array substrate which includes a plurality of pixel structures, wherein each of the pixel structures includes a scan line, a data line, an active device, and a pixel electrode. The top substrate may be termed an opposite substrate or a color filter substrate, which may be a blank substrate, a substrate which has electrodes disposed thereon, or a substrate which has a color filter disposed thereon. In the first main device 100, the active region A of the electronic apparatus may be termed a display region, and the peripheral region P may be termed a driving circuit region or a peripheral circuit region.

The second main device 200 is a touch panel. According to the type of the touch panel (capacitive touch panel, resistive touch panel, or optical touch panel), the elements in the second main device 200 are not necessarily the same. Since the touch panel may be any know type of capacitive touch panel, resistive touch panel, or optical touch panel, the elements in the touch panel are not redundantly described. In the second main device 200, the active region A of the electronic apparatus may be termed a touch region, and the peripheral region P may be termed a peripheral circuit region.

An optically clear liquid adhesive (OCLA) 300 is applied between the first main device 100 and the second main device 200, and the OCLA 300 is mainly applied in the active region A. In particular, the UCLA 300 is a light-curable adhesive, such as a liquid adhesive which is cured after UV irradiation. In addition, the OCLA 300 preferably has over 90% transparency before curing, and has over 97% transparency after curing. Since the OCLA 300 is applied in the active region A, the OCLA 300 is required to have high enough transparency so as to not affect image display quality of the electronic apparatus. According to the present embodiment, a material of the OCLA 300 is, for example, an OCLA with the model number 08A21X-17 manufactured by SONY Corporation.

A method of applying the OCLA 300 in the active region A between the first main device 100 and the second main device 200 may be any type of known applying processes. The OCLA 300 may be applied to the first main device 100 or the second main device 200. According to an embodiment, a method of applying the OCLA 300 between the first main device 100 and the second main device 200 is applying the OCLA 300 on the second main device 200, and flipping the second main device 200 opposite to or above the first main device 100. The OCLA 300 drips down to the first main device 100 due to gravity and slightly contacts the first main device 100. Afterwards, as a diffusion process (pressing process) proceeds, the contact area between the OCLA 300 and the first main device 100 gradually increases, so that the OCLA gradually and uniformly diffuses outward and/or inward, thereby being beneficial to edging out air at the periphery of the OCLA 300 or to expelling air from the active region A to the peripheral region P.

Figure 1B:
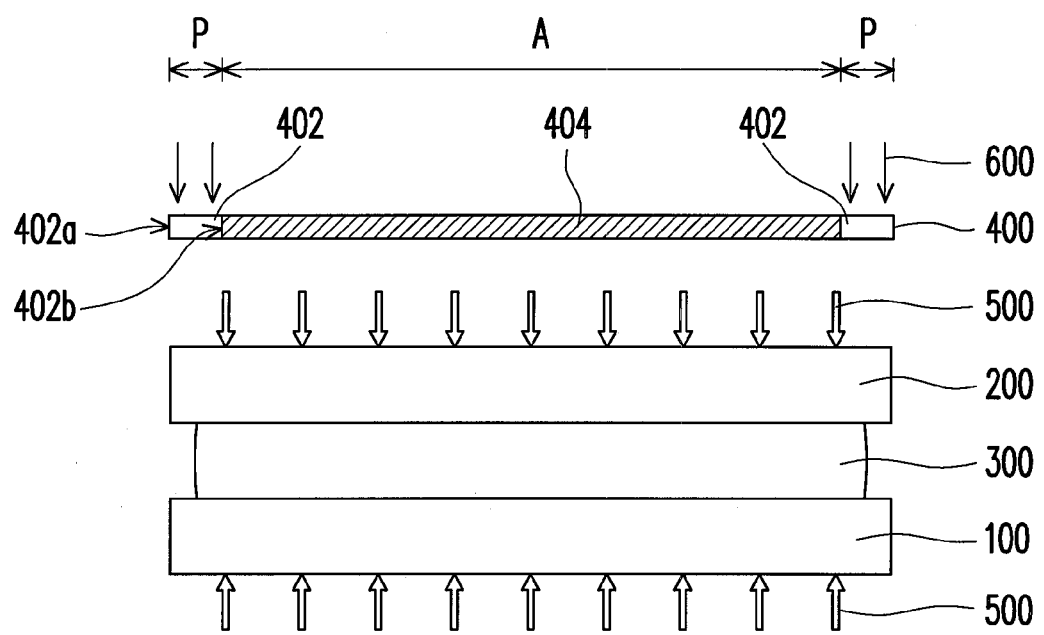
Figure 2:
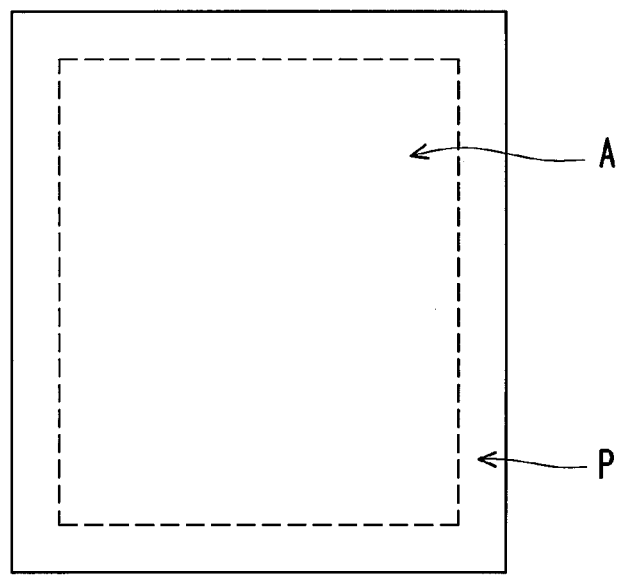
FIG. 2 is a schematic top view of an electronic apparatus according to an embodiment of the disclosure.
Figure 3:
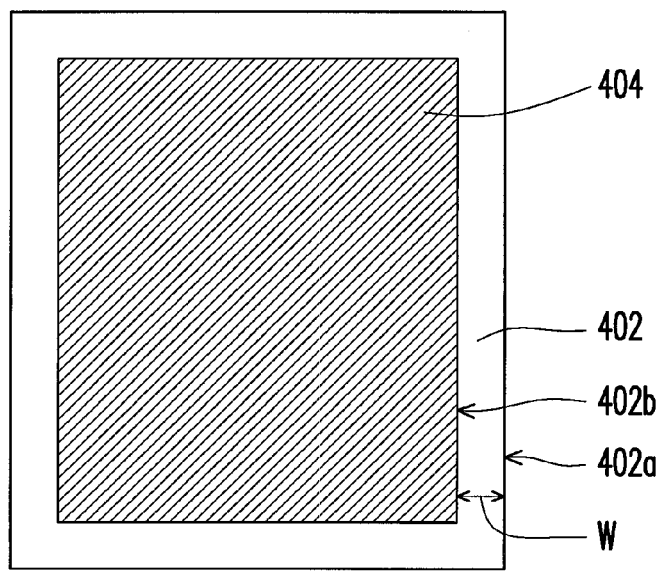
FIG. 3 is a schematic top view of a photo-mask shown in FIG. 1B.

After the OCLA 300 is applied in a central area, an edge area and/or a corner of the active region A of the electronic apparatus, wherein the active region A is located between the first main device 100 and the second main device 200, referring to FIG. 1B, a photo-mask 400 is provided above the second main device 200. In particular, as shown in FIGS. 1B and 3, the photo-mask 400 has a transparent region 402 and an opaque region 404. The transparent region 402 corresponds to the peripheral region P, and the opaque region 404 corresponds to the active region A. According to the present embodiment, the transparent region 402 of photo-mask 400 has an outer edge 402a which is an outest edge of the photo-mask 400 and an inner edge 402b which is an edge adjacent to the opaque region 404 or a boundary between the transparent region 402 and the opaque region 404. The outer edge 402a is preferably aligned with a side edge of the first main device 100. The inner edge 402b is located in the peripheral region P or on an edge between the peripheral region P and the active region A, so that the OCLA 300 will be partially cured in the peripheral region P or on the edge between the peripheral region P and the active region A during the following irradiating process, so as to prevent the OCLA 300 that is not yet cured from flowing outside the first main device 100 and/or the second main device 200 and leading or guiding the OCLA 300 that is not yet cured flowing and filling within the active region A. A width of the transparent region 402 of the photo-mask 400 is from 2 to 100 inches. In practice, the width of the transparent region 402 is sometimes required to exceed the side edge of the first main device 100 and/or the second main device 200. In brief, a size of the transparent region 402 changes with a size of the first main device 100 and/or the second main device 200 whether aligns or exceeds with the peripheral region P.

Then, an OCLA diffusion process is performed such that the OCLA 300 diffuses from the active region A to the peripheral region P. In particular, when performing the OCLA diffusion process, a first irradiating process 600 is simultaneously performed with the photo-mask 400, so that the OCLA 300 is partially cured when it diffuses to the peripheral region P.

According to the present embodiment, the OCLA diffusion process further includes a pressing process 500 of pressing the first main device 100 and the second main device 200. In other words, according to the present embodiment, the OCLA diffusion process may include exerting pressure on the second main device 200 towards the first main device 100, so that the OCLA 300 diffuses from the active region A to the peripheral region P. During the pressing process 500, the first irradiating process 600 is also performed on the OCLA 300 with the photo-mask 400. According to an embodiment, a wavelength of light used in the first irradiating process 600 is 300-400 nm, an irradiating intensity is 3600-5400 mW/cm$^2$, and an irradiating time is 1.6-2.4 seconds.

Since light in the first irradiating process 600 is only able to penetrate the transparent region 402 of the photo-mask 400, the OCLA 300 diffused to the transparent region 402 is cured by irradiation. In further detail, changes in physical properties of the OCLA 300 diffused to the transparent region 402 are generated due to irradiation. For example, hardness and viscosity of the OCLA 300 diffused to the transparent region 402 gradually increase with the irradiating time, so that a diffusion speed is gradually reduced. When the OCLA 300 in the transparent region 402 is partially cured, it stops diffusing and flowing. Since the OCLA 300 in the opaque region 404 is not irradiated, the OCLA 300 in the opaque region 404 continues to diffuse outward and/or inward during the OCLA diffusion process until the gap between the first main device 100 and the second main device 200 in the active region A (corresponding to the opaque region 404) is completely filled by the OCLA 300, so as to ensure that during subsequent processes, the first main device 100 and the second main device 200 are completed bonded to each other in the active region A, and display quality is not affected by bubbles or gaps.

Figure 4A:
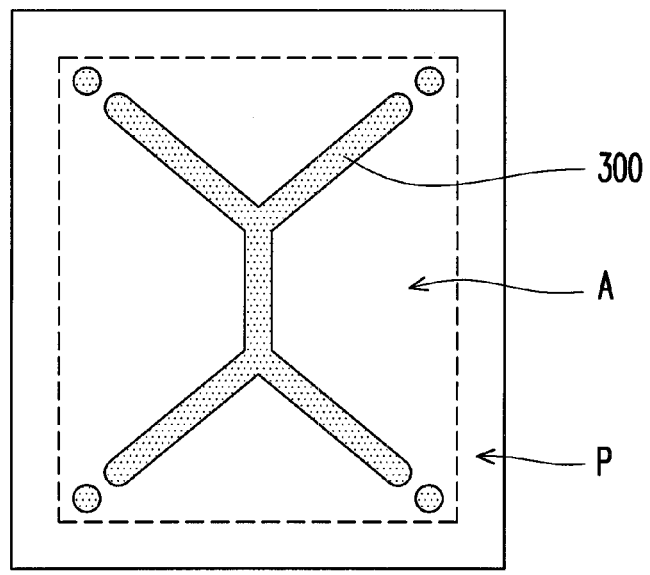
FIGS. 4A to 4D are schematic diagrams showing an optically clear liquid adhesive diffusion process according to an embodiment of the disclosure.

The process of applying the OCLA and the OCLA diffusion process are shown in FIGS. 4A to 4D. In FIG. 4A, the OCLA 300 is applied in the active region A. In order to ensure that the OCLA 300 is evenly diffused, the OCLA 300 should preferably have an applying shape/pattern in a central area and/or an edge area of the active region A of the electronic apparatus a such as a fish bone-shaped portion that shown in FIG. 4A. The fish bone-shaped portion comprises a main bone portion and a plurality of oblique bone portions. Included angles between the main bone portion and the oblique bone portions may be the same or different. For example, the included angles may decrease from a central part of the main bone portion to two terminal parts of the main bone portion. According to the present embodiment, since a dot-shaped portion of the OCLA 300 is applied at each of the four corner s of the active region A, during the subsequent OCLA diffusion process, the OCLA 300 evenly diffuses towards each direction, thereby filling the four corners of the active region A. However, the applying shape/pattern of the OCLA 300 is not limited to the above shape/pattern. In another embodiment, according to a size of the electronic apparatus and a type or composition of the OCLA 300, the applying shape/pattern of the OCLA 300 may be another shape/pattern.

Figure 4B:
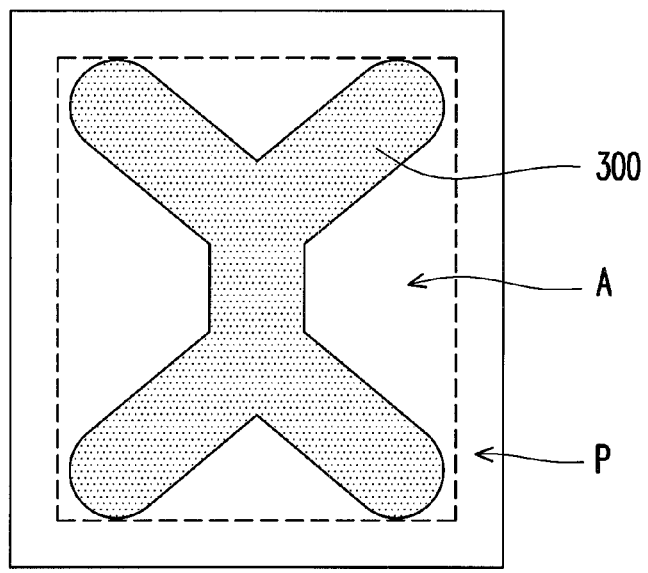
Figure 4C:
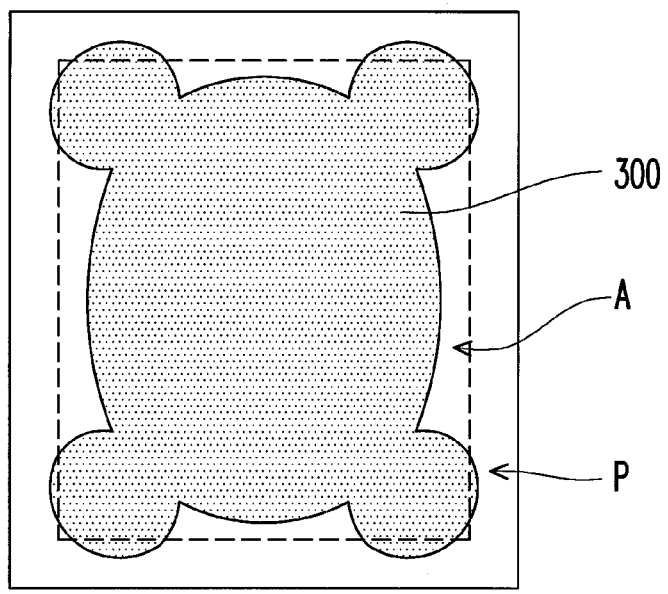
Figure 4D:
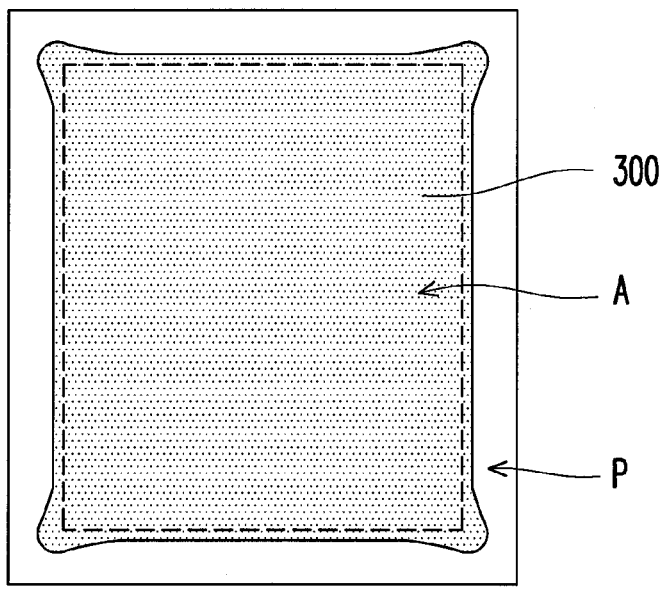

Afterwards, during the OCLA diffusion process (such as shown in FIG. 1B), the OCLA 300 diffuses in a manner shown in FIGS. 4B and 4C. In other words, the OCLA 300 gradually and uniformly diffuses from the active region A to the peripheral region P. When the OCLA 300 diffuses to the peripheral region P, since light in the first irradiating process passes through the peripheral region P, the OCLA 300 gradually stops flowing and forms a result as shown in FIG. 4D. In other words, the OCLA 300 completely fills the active region A even in a little space at an corner of the active region A and partially diffuses to the peripheral region P in FIG. 4D.

Still referring to FIG. 1B, since the OCLA 300 corresponding to the transparent region 402 of the photo-mask 400 is cured and stops diffusing, the OCLA 300 corresponding to the opaque region 404 is blocked by the OCLA 300 corresponding to the transparent region 402 and does not flow outside the gap between the first main device 100 and the second main device 200 but flows along an edge of the cured OCLA 300 to an area in the opaque region 404 not occupied by the OCLA 300, so that the opaque region 404 or the active region A are fully filled by the OCLA 300, and no partial overflow to the transparent region 402 or the peripheral region P or lack of the OCLA 300 in the opaque region 404 or the active region A occurs.

Figure 1C:
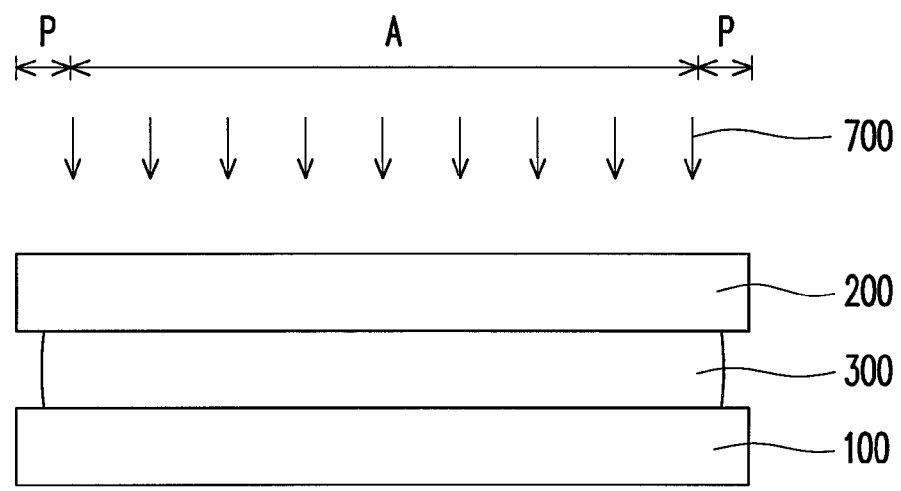

Next, as shown in FIG. 1C, the photo-mask 400 is removed and a second irradiating process 700 is performed, so that the OCLA 300 is fully cured. According to an embodiment, a wavelength of light used in the second irradiating process 700 is 300-400 nm, an irradiating intensity is 100-150 mW/cm$^2$, and an irradiating time is 57.6-86.4 seconds. In order words, no photo-mask is used during the second irradiating process 700, so that during the second irradiating process 700, the UCLA 300 is fully irradiated and fully cured. In other words, the OCLA 300 originally corresponding to the opaque region 404 or the active region A is cured by the second irradiating process 700, and the OCLA 300 corresponding to the transparent region 402 or the peripheral region P is not only cured by the first irradiating process 500, but also affected by the second irradiating process 700 so that a curing rate of the OCLA 300 is further increased. The first main device 100 and the second main device 200 are hence adhered to each other, thereby forming the electronic apparatus shown in FIGS. 1D and 4D.

Figure 1D:
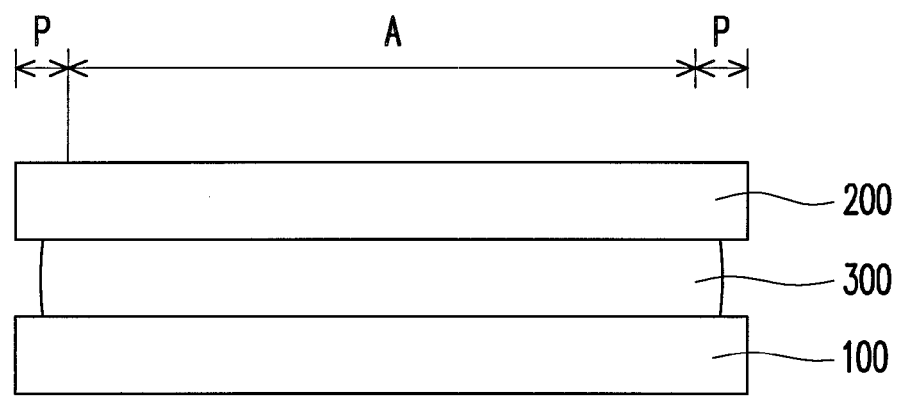

Therefore, the electronic apparatus formed by the above method is shown in FIGS. 1D and 4D and includes the first main device 100, the second main device 200, and the cured OCLA 300. The first main device 100 and the second main device 200 are disposed opposite to each other. The cured OCLA 300 is disposed between the first main device 100 and the second main device 200 and fully fills the active region A and partially diffuses to the peripheral region P.

Similarly, since the OCLA 300 which diffuses to the peripheral region P undergoes the first irradiating process 600 and the second irradiating process 700, the OCLA 300 which diffuses to the peripheral region P has a longer curing time. In addition, since the OCLA 300 which fully fills the active region A undergoes only the second irradiating process 700, the OCLA 300 which fully fills the active region A has a shorter curing time. In other words, in the electronic apparatus shown in FIG. 1D, a curing rate R1 of the cured OCLA 300 which fully fills the active region A is less than a curing rate R2 of the cured OCLA 300 which diffuses to the peripheral region P. The curing rate of the cured OCLA 300 may be measured by high-performance liquid chromatography (HPLC) or Fourier transformed infrared (FTIR). According to the present embodiment, the curing rate R1 may range from 90%-100%, and the curing rate R2 may also range from 90%-100%. For instance, when the curing rate R1 equals 90%, the curing rate R2 may be 91% but not be 90%. As the same reason, when the curing rate R2 equals 100%, the curing rate R1 may be 99% but not be 100%. The curing rate R1 is always less than the curing rate R2.

In summary, when performing the OCLA diffusion process, the first irradiating process is also performed with the photo-mask, so that the OCLA is partially cured when it diffuses to the peripheral region. Since the OCLA is gradually cured after irradiation, the method in the disclosure prevents problems of adhesive overflow during conventional adherence processes.

Moreover, the first irradiating process is performed with the photo-mask so that the OCLA is partially cured when it diffuses to the peripheral region, and the OCLA in the active region continues to flow outward and/or inward until the OCLA completely fills the active region. Therefore, by using the photo-mask and the first irradiating process, in addition to preventing adhesive overflow, a usage amount of the OCLA is also controlled.

It will be apparent to those skilled in the art that various modifications and variations can be made to the disclosure without departing from the scope or spirit of the disclosure. In view of the foregoing, it is intended that the disclosure cover modifications and variations of this disclosure provided they fall within the scope of the following claims and their equivalents.

What is claimed is:

1. A method of fabricating an electronic apparatus, the electronic apparatus having an active region and a peripheral region surrounding the active region, the method comprising:
   providing a first main device and a second main device;
   applying an optically clear liquid adhesive between the first main device and the second main device, and the optically clear liquid adhesive is applied in the active region;
   disposing a photo-mask above the second main device, wherein the photo-mask has a transparent region and an opaque region, and the transparent region corresponds to the peripheral region;
   performing an optically clear liquid adhesive diffusion process, so that the optically clear liquid adhesive diffuses from the active region to the peripheral region, during the optically clear liquid adhesive diffusion process, further performing a first irradiating process with the photo-mask, so that the optically clear liquid adhesive is partially cured when the optically clear liquid adhesive diffuses to the peripheral region;
   removing the photo-mask; and
   performing a second irradiating process, so that the optically clear liquid adhesive is fully cured.

2. The method of fabricating the electronic apparatus as claimed in claim 1, wherein the transparent region of the photo-mask has an outer edge and an inner edge, the outer edge being aligned with a side edge of the first main device, and the inner edge being located in the peripheral region or on an edge between the peripheral region and the active region.

3. The method of fabricating the electronic apparatus as claimed in claim 1, wherein a width of the transparent region is from 2 to 100 inches.

4. The method of fabricating the electronic apparatus as claimed in claim 1, wherein the optically clear liquid adhesive diffusion process comprises a pressing process of pressing the first main device and the second main device.

5. The method of fabricating the electronic apparatus as claimed in claim 1, wherein the optically clear liquid adhesive has over 90% transparency before curing.

6. The method of fabricating the electronic apparatus as claimed in claim 1, wherein the optically clear liquid adhesive has over 97% transparency after curing.

7. The method of fabricating the electronic apparatus as claimed in claim 1, wherein a wavelength of light used in the first irradiating process is 300-400 nm, an irradiating intensity is 3600-5400 mW/cm2, and an irradiating time is 1.6-2.4 seconds.

8. The method of fabricating the electronic apparatus as claimed in claim 1, wherein a wavelength of light used in the second irradiating process is 300-400 nm, an irradiating intensity is 100-150 mW/cm2, and an irradiating time is 57.6-86.4 seconds.

9. The method of fabricating the electronic apparatus as claimed in claim 1, wherein after the second irradiating process, a curing rate of the cured optically clear liquid adhesive which fully fills the active region is less than a curing rate of the cured optically clear liquid adhesive which diffuses to the peripheral region.

10. The method of fabricating the electronic apparatus as claimed in claim 9, wherein the curing rate of the cured optically clear liquid adhesive which fully fills the active region and the curing rate of the cured optically clear liquid adhesive which diffuses to the peripheral region respectively range from 90%-100% of fully curing.

11. The method of fabricating the electronic apparatus as claimed in claim 1, wherein the transparent region of the photo-mask has a frame shape surrounding the opaque region.

12. The method of fabricating the electronic apparatus as claimed in claim 1, wherein the first main device comprises a display panel and the second main device comprises a touch panel.

13. The method of fabricating the electronic apparatus as claimed in claim 1, wherein the optically clear liquid adhesive is applied on the first main device or the second main device.

14. The method of fabricating the electronic apparatus as claimed in claim 13, wherein applying then optically clear liquid adhesive between the first main device and the second main device comprises:
   applying the optically clear liquid adhesive on the second main device; and
   flipping the second main device opposite to or above the first main device, such that the optically clear liquid adhesive drips down to the first main device and contacts the first main device.

15. The method of fabricating the electronic apparatus as claimed in claim 13, wherein the optically clear liquid adhesive applied on the second main device has an applying pattern having a dot-shaped portion at each of the four corners of the active region.

16. The method of fabricating the electronic apparatus as claimed in claim 13, wherein the optically clear liquid adhesive applied on the second main device has an applying pattern having a fish bone-shaped portion.

17. The method of fabricating the electronic apparatus as claimed in claim 1, wherein during the first irradiating process, the optically clear liquid adhesive in the peripheral region is cured so as to stop the optically clear liquid adhesive in the active region from diffusing to the peripheral region.

* * * * *